United States Patent [19]
Ramsey et al.

[11] Patent Number: 5,587,605
[45] Date of Patent: Dec. 24, 1996

[54] PACKAGE FOR MATING WITH A SEMICONDUCTOR DIE

[75] Inventors: Kenneth C. Ramsey, Gilbert; William J. Miller, Mesa; William M. Strom, Chandler, all of Ariz.

[73] Assignee: Motorola, Inc., Schaumburg, Ill.

[21] Appl. No.: 473,833

[22] Filed: Jun. 7, 1995

Related U.S. Application Data

[62] Division of Ser. No. 155,880, Nov. 23, 1993, abandoned.

[51] Int. Cl.$^6$ .......................... H01L 23/495; H01L 27/15; H01L 31/12
[52] U.S. Cl. ........................... 257/666; 257/81; 257/692; 257/787
[58] Field of Search ..................... 257/666, 667, 257/669, 670, 672, 674, 692, 695, 787, 678, 81, 82

[56] References Cited

U.S. PATENT DOCUMENTS 4,982,268  1/1991  Schuermann .......................... 257/666

*Primary Examiner*—Carl Whitehead, Jr.
*Attorney, Agent, or Firm*—Rennie W. Dover

[57] ABSTRACT

An interconnect package (35) for interconnecting electrical system components. A first leadframe (10) having leads (11) is encapsulated within a molding compound forming a first section (36) of the interconnect package (35). The first section (36) optionally includes channels (54). A second leadframe (20) having leads (22, 23) is encapsulated within a molding compound forming a second section (37) of the interconnect package (35). The first and second sections (36 and 37, respectively) are coupled together with an adhesive material (43). An end (44) is removed from the interconnect package (35) forming an edge (50). A semiconductor chip (51) is coupled to the edge (50).

21 Claims, 4 Drawing Sheets

PACKAGE FOR MATING WITH A SEMICONDUCTOR DIE

This is a division of application Ser. No. 08/155,880, filed Nov. 23, 1993, now abandoned.

FIELD OF THE INVENTION

The present invention relates, in general, to interconnect packages, and more particularly, to interconnect packages for mating with a semiconductor die.

BACKGROUND OF THE INVENTION

Systems used in such areas as communications, test, control, computation, etc. typically employ semiconductor devices for transmission and processing of electrical signals. Important factors impacting such system parameters as speed and thermal performance include the packages used for housing or supporting the semiconductor devices and the interconnect structures between the various systems components.

One approach to improving system level performance is to mount the circuitry in multi-chip modules and subsequently use these modules to manufacture the system. Advantages of this packaging technique include an overall reduction in board space and shorter electrical paths between devices. However, conventional multi-chip module packaging techniques still require a substantial area in order to fit the semiconductor devices and interconnects in the module.

Accordingly, it would be advantageous to have a method and means of interconnecting semiconductor devices that are compatible with multi-chip module technology and that reduce the size of the multi-chip module. It would be of further advantage for the method and means to improve system performance by decreasing the interconnect lengths.

DETAILED DESCRIPTION OF THE DRAWINGS

Figure 1:
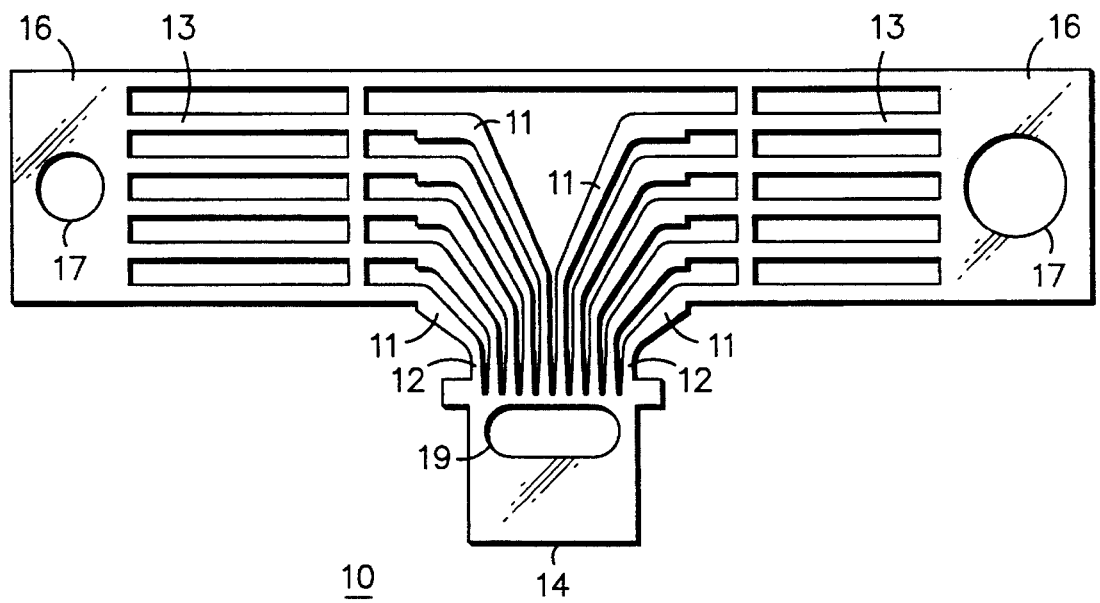
FIGS. 1 and 2 illustrate patterned leadframes to be manufactured into an interconnect package in accordance an embodiment of the present invention.

Interconnecting the various components found in electrical systems is a critical step in systems design and operation. The present invention provides a package for mating with a semiconductor chip or die and a method of manufacturing the package. In one embodiment, the step of mating is accomplished by encapsulating a portion of a leadframe in plastic and attaching the semiconductor chip directly to at least one leadframe lead. More particularly, the semiconductor chip is attached to an end of the leadframe lead and is external to the package. In addition, an optical path may be formed through the package, wherein the optical path is aligned with an optical emitter or receiver on the semiconductor chip when the chip is properly attached to the leadframe lead. The package is capable of providing an electrical path to a substrate or circuit board by means of conventional surface mount or through-hole techniques. Further, the optical path includes an alignment and positioning feature for attachment of optical cabling. It shall be understood that the same reference numerals are used in the figures to denote the same elements.

FIG. 1 illustrates one embodiment of a patterned leadframe 10 to be encapsulated using the method of the present invention. The leadframe 10 is patterned to have a plurality of leads 11, each lead having a first end 12 adjacent another first end 12 and a second end 13 adjacent another second end 13. The ends 12 and 13 are also referred to as tips. The ends 12 are coupled together via a first coupling element 14 and the ends 13 are coupled together via a second coupling element 16. The coupling elements 14 and 16 provide a means for holding the ends 12 and 13, respectively, in position along the x, y, and z axes of the Cartesian coordinate system during leadframe fabrication and package assembly. The coupling element 16 has holes 17 that serve as datum features for assembly tooling. The coupling element 14 has a hole 19 that serves as a locking feature for securing the molding compound to the leadframe, i.e. the hole 19 serves as a molding compound-to-leadframe locking feature.

In addition, the first coupling element 14 serves as a precise locator of the leadframe position along the z-axis of the mold cavity. The leadframe 10 may be patterned using techniques such as etching, punching, stamping, etc. The tapered configuration of the space separating the leads at the ends 12 and the coupling element 14 results in a corresponding flared configuration of the ends 12 when they are separated from the coupling element 14. Techniques for separating the coupling element 14 are described with reference to FIG. 4.

Figure 2:
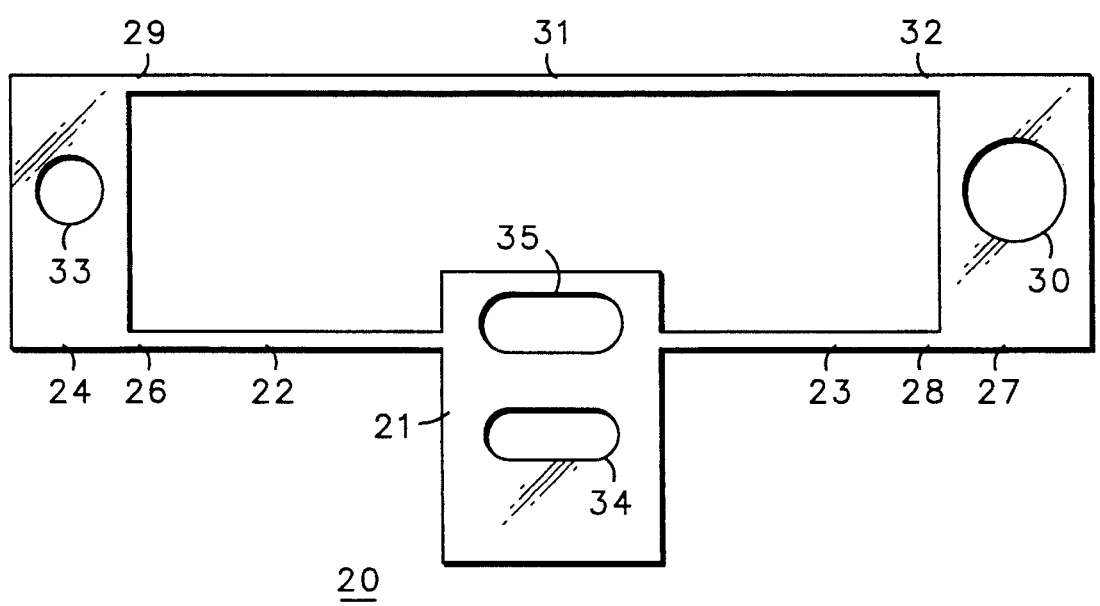

FIG. 2 illustrates a second embodiment of a patterned leadframe 20 to be encapsulated using the method of the present invention. The leadframe 20 provides an electrical path between the semiconductor chip 51 of FIG. 4 and a substrate or circuit board (not shown) using conventional surface mount or through-hole techniques. In addition, the leadframe 20 has an optional conductive plane 21 that serves as either a heatsink or as a heatspreader.

A lead 22 extends from one side of the conductive plane 21, and a lead 23 extends from the opposing side of the conductive plane 21. A coupling element 24 is connected to an end 26 of the lead 22. In addition, a coupling element 27 is connected to the end 28 of the lead 23. An end 29 of a tie-bar 31 is coupled to the end 26 of the lead 22 by the coupling element 24. An end 32 of the tie-bar 31 is coupled to the end 28 of the lead 23 by the coupling element 27. The leads 22 and 23 provide an electrical path between the conductive plane 21 and a substrate or circuit board (not shown). The tie-bar 31 provides mechanical strength to the leadframe configuration. The coupling elements 24 and 27 hold the leads in position during the assembly operations and the holes 30 and 33 serve as datum features for assembly tooling. The holes 34 and 35 of the conductive plane 21 serve as a molding compound-to-leadframe locking feature. In addition, the conductive plane 21 serves to hold the leads 22 and 23 in position along the x, y, and z axes of the Cartesian coordinate system during leadframe fabrication and package assembly. The leadframe 20 may be patterned using the same techniques described supra for patterning the leadframe 10.

Figure 3:
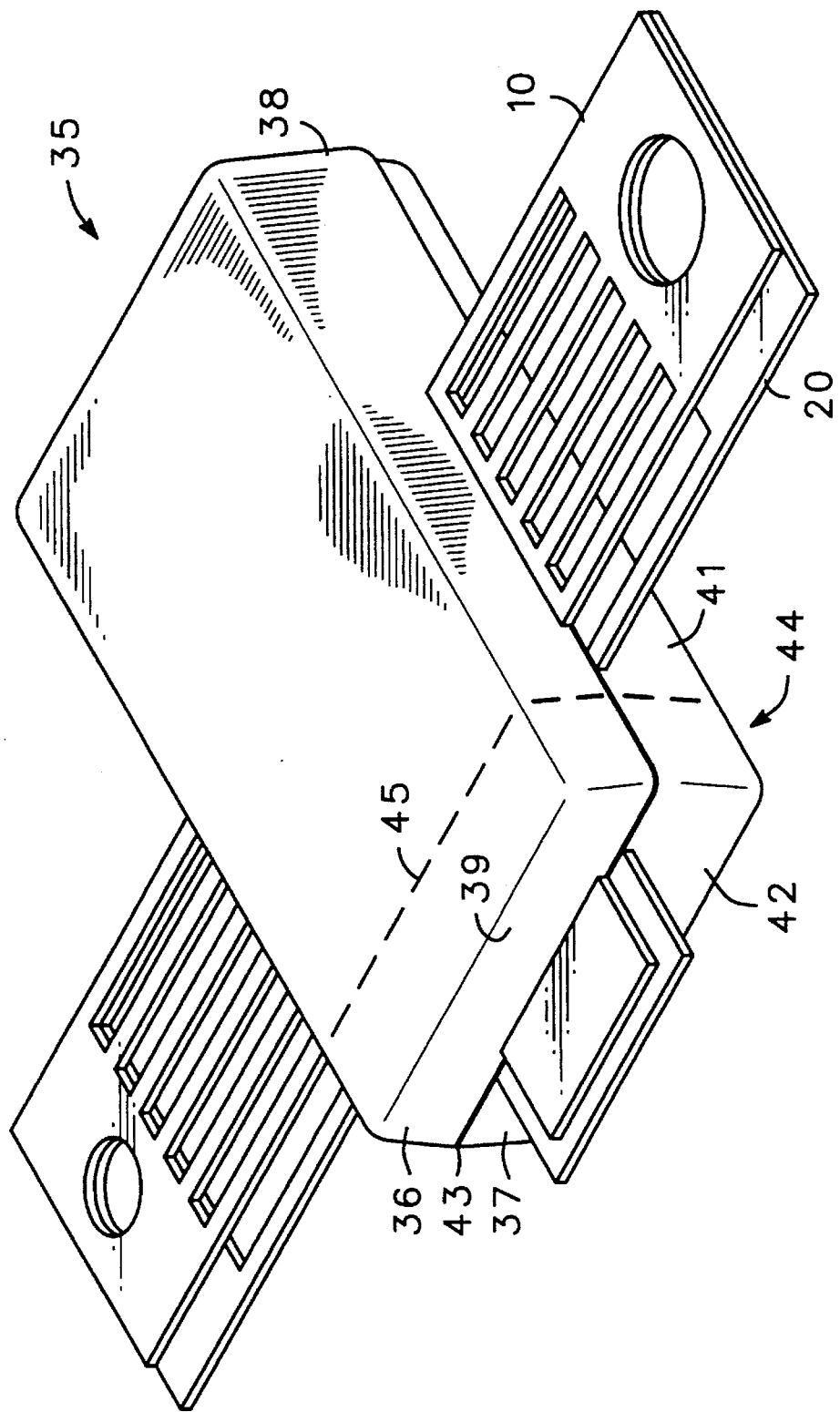
FIGS. 3 and 4 illustrate an interconnect package during progressive stages of manufacture in accordance with an embodiment of the present invention.

FIG. 3 illustrates an interconnect package 35 comprising a first section 36, a second section 37, and an end 44. The first section 36 has a major surface 39 and comprises the patterned leadframe 10 encapsulated by a molding compound 38. The second section 37 has a major surface 42 and comprises the patterned leadframe 20 encapsulated by a molding compound 41. In one example, the molding compound encapsulating the leadframe 10 is the same as the molding compound encapsulating the leadframe 20. In another example, the molding compound encapsulating the leadframe 10 is different from the molding compound encapsulating the leadframe 20. Methods of encapsulating the leadframes 10 and 20 are well known in the art and include techniques such as transfer molding whereby portions of the leadframes 10 or 20 are positioned in a cavity formed by placing upper and lower mold chases (not shown) in a closed configuration. The leadframe is clamped between the mold chases when they are in the closed configuration. Mold chases are well known to those skilled in the art.

It is further known in the art that molding compound is injected into the mold cavity, thereby encapsulating all portions of the leadframe within the mold cavity. Since the molding compound is typically a thermo-setting material, this process is performed at elevated temperatures, and results in the molding compound retaining the configuration of the mold cavity when the mold is opened, i.e., when the upper and lower mold chases are in an open configuration. Although it is shown that sections 36 and 37 are each formed separately using this technique, it shall be understood that this is not a limitation of the present invention. For example, the interconnect package 35 may be formed as a unitary package.

A feature of each of the sections 36 and 37 is that the interface surfaces 39 and 42, respectively, are configured to provide self aligning inter-locking tapered surfaces. In addition, channels or grooves (elements 54 of FIGS. 4 and 5) may be formed along the entire length of the major surface 39 of the section 36. FIG. 3 further illustrates the leadframe 10 exits the package 35 in one plane and the leadframe 20 exits the package 35 in another plane.

The major surface 39 is coupled to the major surface 42 via an adhesive material 43. The adhesive material 43 bonds sections 36 and 37 together and fills the channels 54 (FIGS. 4 and 5) formed in the surface 39. Preferably, the adhesive material 43 is a light coupling material or a light transmitting adhesive material having a light refractive index that, in cooperation with the light refractive index of the molding compound used in the sections 36 and 37, forms a light path along the channels 54. Although the interconnect package 35 is illustrated as sections 36 and 37 being bonded together, it shall be understood that other embodiments of the interconnect package include a single leadframe lead molded in accordance with, for example, the leadframe 10, or more than two leadframes coupled or bonded together.

Figure 4:
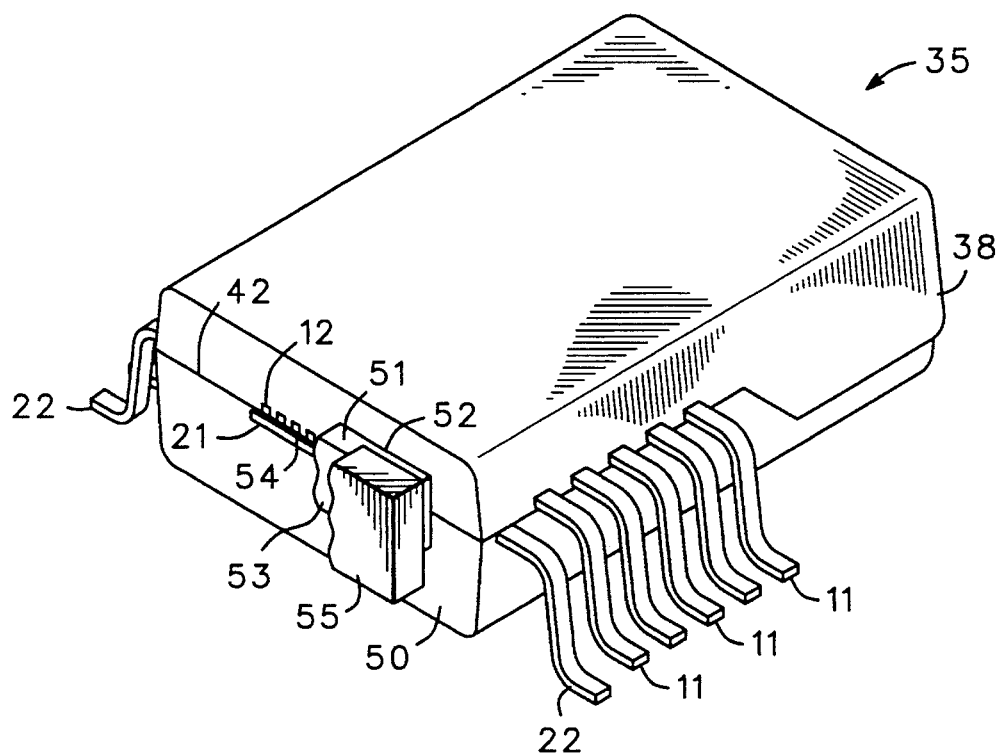

FIG. 4 illustrates a perspective view of the interconnect package 35 after trimming and forming the leads 11 and 22 and after removing the end 44 of the interconnect package 35. The end 44 is removed at dashed line 45. It shall be understood that the position of dashed line 45 along the interconnect package 35 is not a limitation of the present invention. Methods of trimming and forming the leads 11 and 22 are well known to those skilled in the art. Removing the end 44 forms an edge 50. By way of example, the removal of the end 44 is accomplished using an abrasive cutting wheel such as a diamond saw. In another example, the end 44 is removed by using a grinder to grind off the end of the package 35 thereby forming the edge 50. In yet another example, a laser beam can be used to cut the end off the package 35. In still another example, a high pressure water jet cutter is used to remove the end of the package. The removal of the end 44 provides access to the flared configuration of the ends 12 of the leadframe 10 than would be possible using conventional leadframe manufacturing techniques.

The purpose of removing the end 44 of the package 35 is to remove the coupling element 14 from the leadframe 10, thereby exposing the ends of the leads 11. In-addition, a portion of the coupling element 21 of the leadframe 20 is removed. The exposed ends 12 of the leads 11 and the edge of the coupling element 21 provide contacts to make electrical connections to a semiconductor chip 51, described presently.

The semiconductor chip 51 has sides or major surfaces 52 and 53 and is coupled to the edge 50 of the interconnect package 35. By way of example, bumps (not shown) on the chip 51 are coupled or bonded to the ends 12 of the leadframe 10. In another example, the leads 11 and 22 electrically contact the semiconductor chip 51 by means of an electrically conductive die attach material such as epoxy (not shown). Such epoxy materials are well known to those skilled in the art. Further, the surface 52 of the chip 51 may be bonded to the edge 50 with an "underfill" adhesive material. This adhesive material forms a mechanical bond between the edge 50 and the surface 52 as well as providing an optical media to enhance light transmission from the semiconductor chip 51 to the optical channels 54.

The die surface 53 is exposed and available for mounting a heatsink 55. Methods of mounting the heatsink 55 to the semiconductor chip 51 are well known to those skilled in the art. For example, the surface 53 may be mounted to the heatsink using a thermally conductive adhesive or solder.

Figure 5:
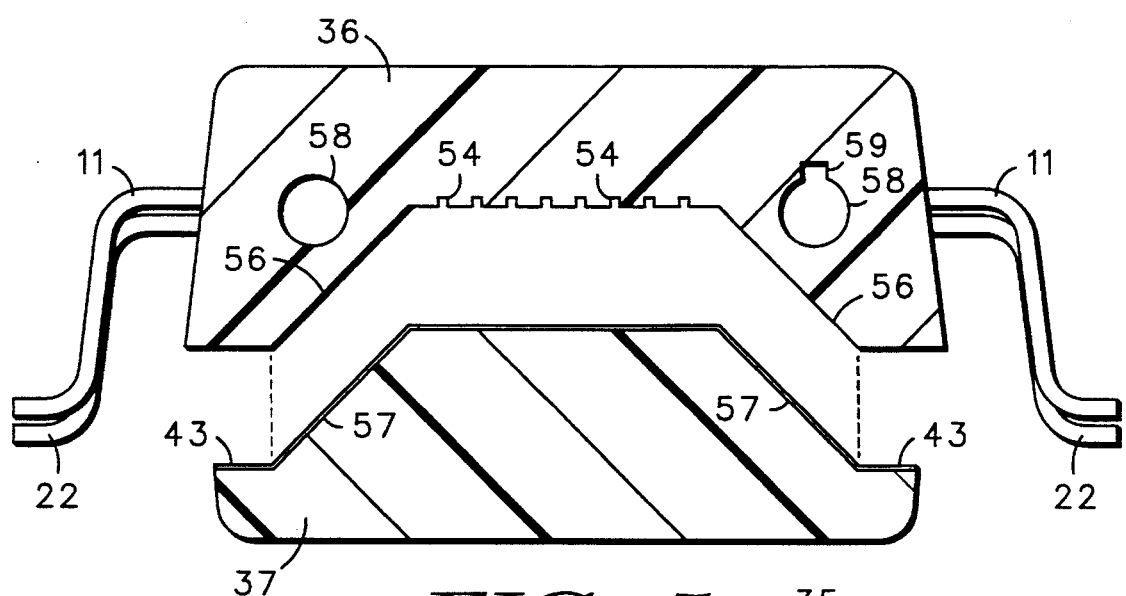
FIG. 5 illustrates an exploded view of the interconnect package of FIGS. 3 and 4, from a backside of the interconnect package.

FIG. 5 illustrates an exploded view of the interconnect package 35 from a backside of the package 35 (FIG. 4). The backside view more clearly shows the tapered configurations in mutually perpendicular planes for self aligning of the sections 36 and 37. More particularly, FIG. 5 illustrates that the tapered portion 56 slides on the tapered portion 57 to properly align the sections 36 and 37. In addition, the adhesive material 43 is shown, wherein the adhesive material fills the channels 54 and forms light transimssion paths as described with reference to FIG. 3. Although the channels 54 are shown as being formed in the section 36, it shall be understood that the channels 54 may be formed in the section 37.

FIG. 5 additionally shows holes 58 which cooperate with pins in a fiber optic cable connector (not shown) to align the fiber optic cable connector with the interconnect package 35. Thus, the holes 58 serve as alignment aids. It shall be understood that although the holes are preferable, they are an optional feature. Further, the holes 58 could have various shapes such as slots, keys, splines, etc. The holes 58 may include an orientation structures 59 for proper orientation of the fiber optic cable connector when mating with a package 35. Suitable orientation structures 59 include splines, keys, slots, or the like having asymmetric configurations thereby providing a one-way orientation when mating with the fiber optic cable connector. Although the alignment aid is shown in a single hole 58, it shall be understood that the alignment aid may be present in more than one hole 58. It shall be further understood that the alignment aid may be realized by making one hole 58 having a different size than other holes 58 or by patterning the holes 58 to be asymmetric.

Figure 6:
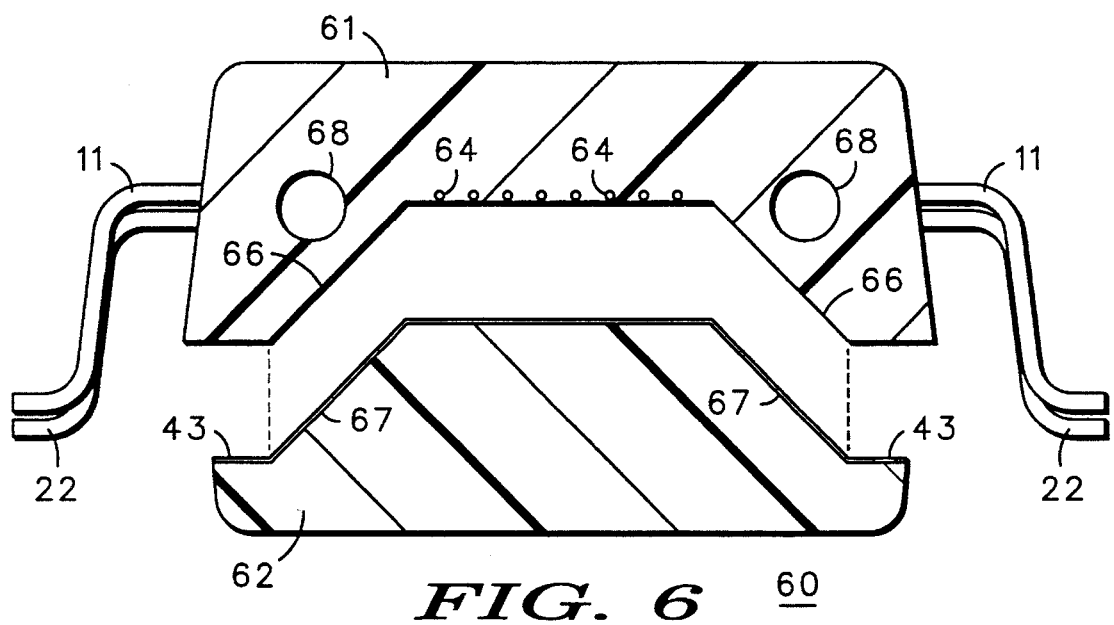
FIG. 6 illustrates an exploded view from a backside of another embodiment of the interconnect package in accordance with the present invention.

FIG. 6 illustrates an interconnect package 60 having sections 61 and 62 bonded together by an adhesive material 43. The sections 61 and 62 are analogous to the sections 36 and 37 and the tapered portions 66 and 67 are analogous to the tapered portions 56 and 57, respectively. In addition, optical fibers are encapsulated with the leadframe 10 to form the section 61. The optical fibers 64 perform the same function as the light transmission channels 54. The section 61 includes holes 68 which serve as alignment aids similar to the alignment aids 58 of FIG. 5. The leadframe 20 having the leads 22 is-encapsulated to form the section 62.

Figure 7:
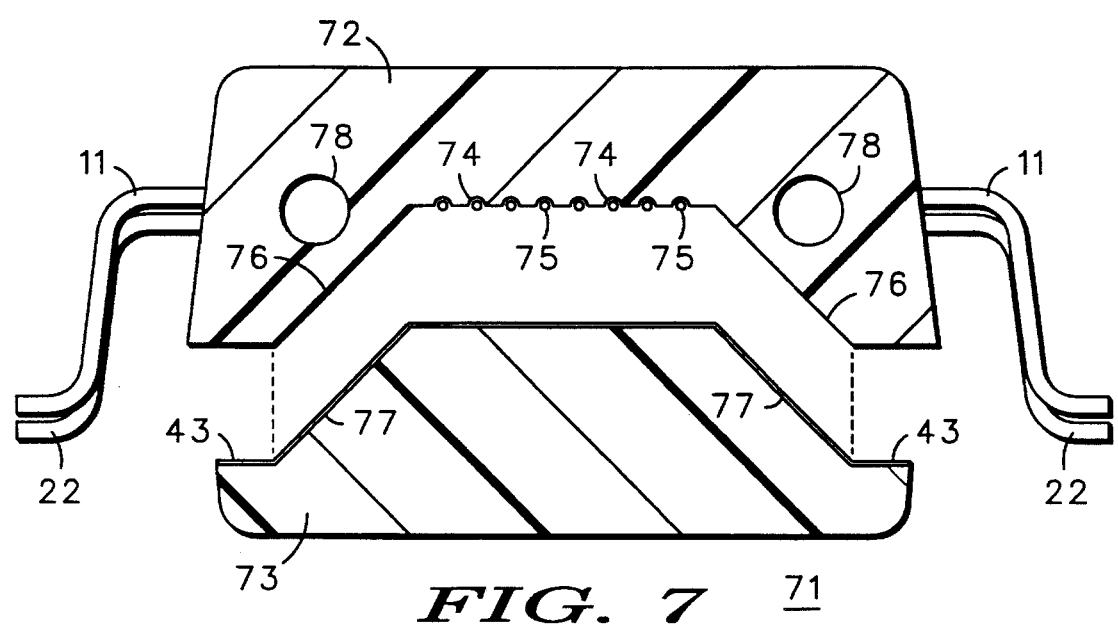
FIG. 7 illustrates an exploded view from a backside of yet another embodiment of the interconnect package in accordance with the present invention.

FIG. 7 illustrates an interconnect package 71 comprising the sections 72 and 73 bonded together by the adhesive material 43, wherein the section 72 includes channels 74 for mating with optical fibers 75. Although the optical fibers 75 perform the same function as the optical fibers 64, they are not molded together with the leadframe 10 as in the section 61. More particularly, the optical fibers 75 are placed between the sections 72 and 73 and aligned with the channels 74 prior to coupling the sections 72 and 73 together.

In addition to having the channels 74, the section 72 has a leadframe 10 encapsulated therein, wherein the leadframe 10 has leads 11. Further, the section 72 has a leadframe 20 encapsulated therein, wherein the leadframe 20 has leads 22. The sections 71 and 72 are analogous to the sections 36 and 37 and the tapered portions 76 and 77 are analogous to the tapered portions 56 and 57, respectively, of FIG. 5. The section 71 includes holes 78 which serve as alignment aids similar to the alignment aids 58 of FIG. 5.

By now it should be appreciated that an interconnect package and a method for manufacturing the interconnect package have been provided. The present invention eliminates the need for conventional wirebond techniques by providing a direct bonding technique. Further, in optical applications, the semiconductor chips are mounted perpendicular to the light transmission channels, thereby allowing the laser light from the semiconductor chip to exit the semiconductor chip in a configuration perpendicular to the chip surface. Thus, the light is transmitted directly down the channels. Other advantages of the present invention include compatibility with multi-chip module technology, reduction in multi-chip module size, and improvement in system performance by decreasing interconnect lengths.

While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. An interconnect package, comprising at least one patterned leadframe having a plurality of leads, each of the plurality of leads having at least two ends which exit the interconnect package in at least one plane, wherein one end of at least one of the plurality of leads is for mating with a semiconductor chip.

2. An interconnect package as claimed in claim 1, wherein a first end of a first lead of the plurality of leads is adjacent and coupled to a first end of a second lead of the plurality of leads.

3. An interconnect package as claimed in claim 1, wherein the first end of one of the plurality of leads is in a first plane and the first end of another of the plurality of leads is in a second plane.

4. An interconnect package as claimed in claim 1, wherein a first end of at least one of the plurality of leads is flared and a semiconductor die is mated with the first end of the at least one of the plurality of leads.

5. An interconnect package as claimed in claim 1, wherein the interconnect package has a first section comprising a patterned leadframe, wherein a portion of the first section is encapsulated by a first molding compound and a second section comprising a patterned leadframe, wherein a portion of the second section is encapsulated by a second molding compound, and wherein the portion of the first section is coupled to the portion of the second section.

6. An interconnect package as claimed in claim 5, wherein the first and second molding compounds are comprised of one material.

7. An interconnect package as claimed in claim 5, wherein the portion of the first section further comprises grooves formed along a length of the portion.

8. An interconnect package as claimed in claim 7, wherein the portion of the first section and the portion of the second section are coupled via a light coupling material.

9. An interconnect package as claimed in claim 5, wherein the portion of the first section and the portion of the second section have tapered configurations in mutually perpendicular planes, the tapered configurations for self-aligning the portion of the first section and the portion of the second section.

10. An interconnect package as claimed in claim 1, wherein the interconnect package includes an alignment aid, the alignment aid further comprising an orientation structure.

11. A package for mating with a semiconductor die, comprising:

at least one leadframe having an encapsulated portion;

at least one lead of said at least one leadframe having an end, wherein the end is external to said encapsulated portion; and said semiconductor die mated to the end of said at least one lead.

12. The package for mating with a semiconductor die of claim 11, wherein the end of said at least one lead, mated to the semiconductor die, is flared.

13. The package for mating with a semiconductor die of claim 11, wherein said at least one leadframe further comprises a first leadframe and a second leadframe.

14. The package for mating with a semiconductor die of claim 13, wherein the encapsulated portion of the first leadframe is formed from a first material and the encapsulated portion of the second leadframe is formed from a second material.

15. The package for mating with a semiconductor die of claim 14, wherein the encapsulated portion of the first leadframe and the encapsulated portion of the second leadframe coupled using a light coupling material.

16. The package for mating with a semiconductor die of claim 15, wherein the encapsulated portion of the first leadframe and the encapsulated portion of the second leadframe have an interface surface with a length, wherein the interface surface of one encapsulated portion further comprises channels formed along the entire length of the interface surface.

17. The package for mating with a semiconductor die of claim 13, wherein-the encapsulated portion of the first leadframe and the encapsulated portion of the second leadframe each have a tapered configuration in mutually perpendicular planes for, self-aligning the .first leadframe to the second leadframe.

18. The package for mating with a semiconductor die of claim 17, wherein the interface surface of the encapsulated portion of the first leadframe is coupled to the interface surface of the encapsulated portion of the second leadframe via a light coupling material.

19. The package for mating with a semiconductor die of claim 18, wherein the channels form a light path.

20. The package for mating with a semiconductor die of claim 13, wherein the first leadframe and the second leadframe are molded as a unitary package.

21. An interconnect package as claimed in claim 7, wherein the grooves form a light path.

* * * * *